(12) United States Patent
Kim et al.

(10) Patent No.: US 10,906,283 B2
(45) Date of Patent: Feb. 2, 2021

(54) WAFER BONDING APPARATUS FOR DIRECTLY BONDING WAFERS AND A WAFER BONDING SYSTEM HAVING THE SAME

(71) Applicant: SAMSUNG ELECTRONICS CO., LTD., Suwon-si (KR)

(72) Inventors: Tae-Yeong Kim, Yongin-si (KR); Jun-Hyung Kim, Yongin-si (KR); Hoe-Chul Kim, Seoul (KR); Hoon-Joo Na, Seoul (KR); Kwang-Jin Moon, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/387,032

(22) Filed: Apr. 17, 2019

(65) Prior Publication Data

US 2020/0055296 A1    Feb. 20, 2020

(30) Foreign Application Priority Data

Aug. 14, 2018  (KR) .................. 10-2018-0094861

(51) Int. Cl.
*B32B 37/00* (2006.01)
*H01L 21/687* (2006.01)
*B32B 37/10* (2006.01)

(52) U.S. Cl.
CPC ...... *B32B 37/0046* (2013.01); *B32B 37/1054* (2013.01); *H01L 21/68742* (2013.01)

(58) Field of Classification Search
CPC . B32B 37/0046; B32B 37/1054; B32B 41/00; H01L 21/187; H01L 21/67253; H01L 21/67259; H01L 21/68; H01L 21/6838; H01L 21/68742; H01L 2224/753; H01L 2224/75302; H01L 2224/75304; H01L 2224/75305; H01L 2224/75981; H01L 2224/75982; H01L 2224/75983; H01L 2224/75984; H01L 2224/75895
See application file for complete search history.

(56) References Cited

U.S. PATENT DOCUMENTS 5,131,968 A    7/1992  Wells et al.
8,147,630 B2   4/2012  George
(Continued)

FOREIGN PATENT DOCUMENTS

KR  10-2017-0138249  12/2017
KR  10-2018-0041587   4/2018

*Primary Examiner* — George R Koch
(74) *Attorney, Agent, or Firm* — F. Chau & Associates, LLC

(57) ABSTRACT

A wafer bonding apparatus including: a lower chuck to which a lower wafer is secured at a peripheral portion of the lower chuck; an upper chuck to which an upper wafer is secured; a bonding initiator for pressuring a central portion of the upper wafer until the central portion of the upper wafer reaches a central portion of the lower wafer, thereby initiating a bonding process of the upper and the lower wafers by deforming the upper wafer; and a bonding controller for controlling a bonding speed between a peripheral portion of the upper wafer and a peripheral portion of the lower wafer such that the upper wafer becomes un-deformed prior to bonding the peripheral portion of the upper wafer and the peripheral portion of the lower wafer.

19 Claims, 18 Drawing Sheets

(56) References Cited

U.S. PATENT DOCUMENTS

| | | |
|---|---|---|
| 9,418,961 B2 | 8/2016 | Yu et al. |
| 9,875,917 B2 | 1/2018 | George et al. |
| 9,922,851 B2 | 3/2018 | Lin et al. |
| 2007/0287264 A1 | 12/2007 | Rogers |
| 2010/0097738 A1 | 4/2010 | Kang et al. |
| 2015/0214082 A1* | 7/2015 | Huang .............. H01L 21/76251 438/14 |
| 2018/0082864 A1* | 3/2018 | Lin ......................... H01L 24/75 |
| 2018/0108556 A1 | 4/2018 | Takebayashi |
| 2018/0158796 A1* | 6/2018 | Otsuka ................ H01L 21/2007 |
| 2019/0148148 A1* | 5/2019 | Wagenleitner .... H01L 21/67092 438/455 |

* cited by examiner

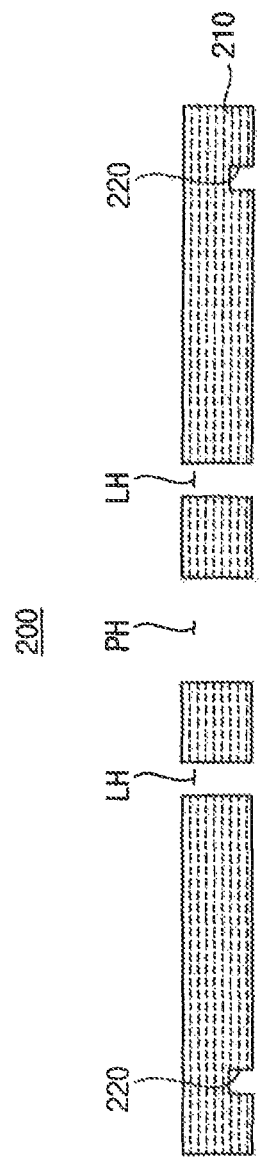

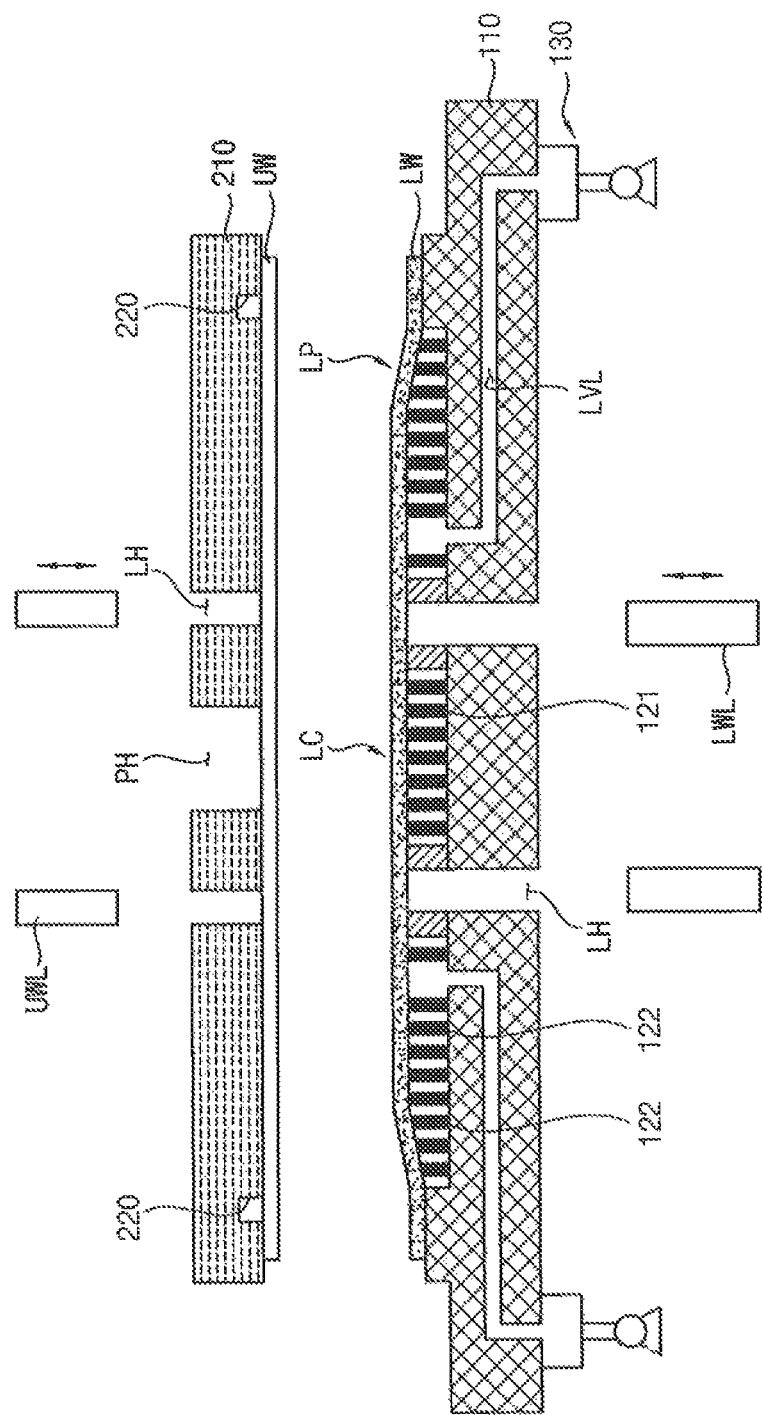

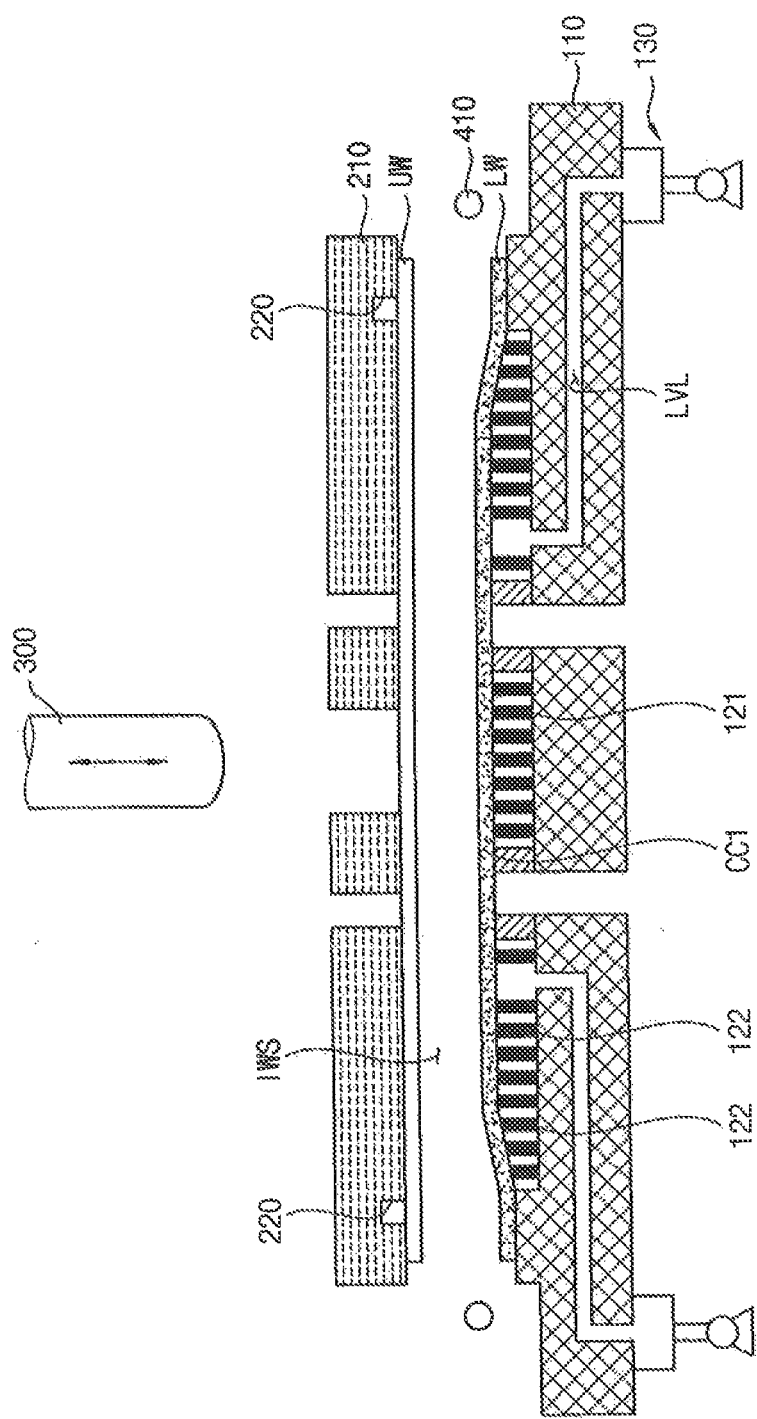

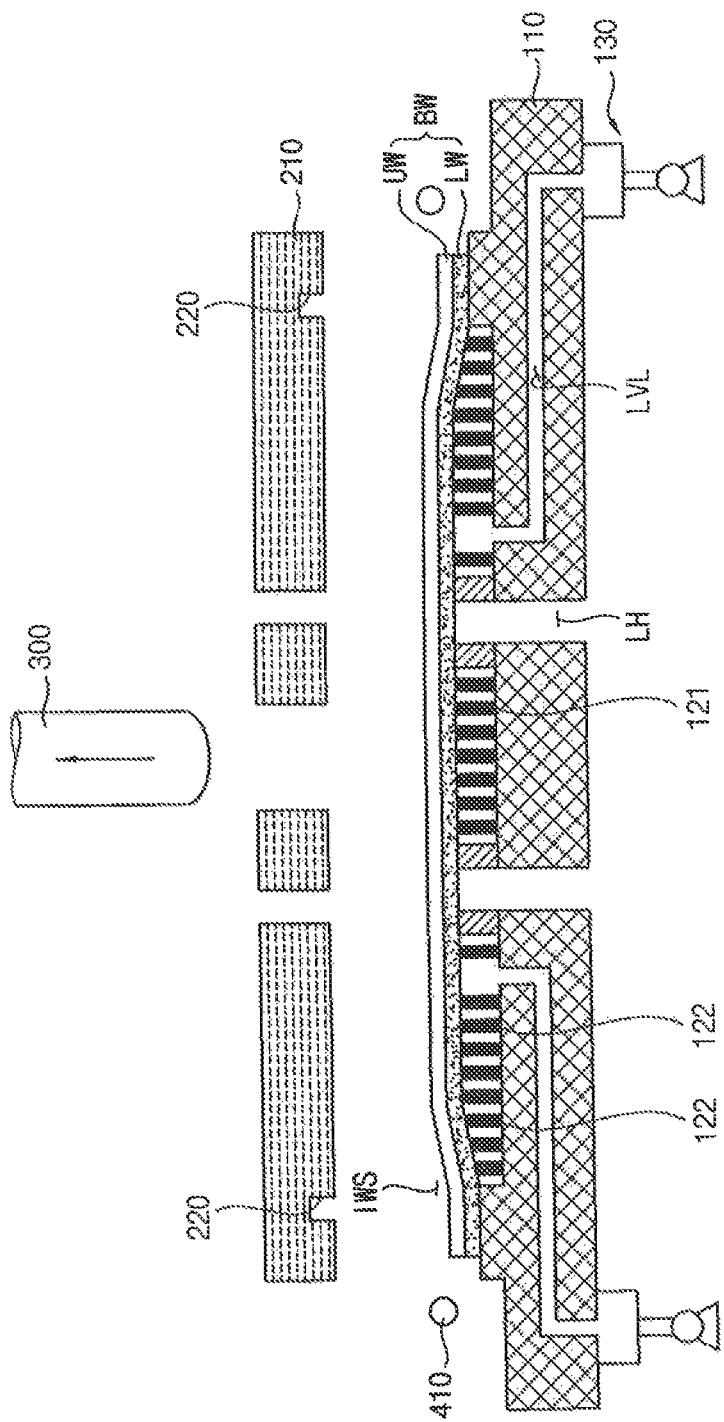

WAFER BONDING APPARATUS FOR DIRECTLY BONDING WAFERS AND A WAFER BONDING SYSTEM HAVING THE SAME

CROSS-REFERENCE TO RELATED APPLICATION

This application claims priority under 35 U.S.C. § 119 to Korean Patent Application No. 10-2018-0094861 filed on Aug. 14, 2018 in the Korean Intellectual Property Office, the disclosure of which is incorporated by reference herein in its entirety

1. TECHNICAL FIELD

Exemplary embodiments of the inventive concept relate to a wafer bonding device, a wafer bonding apparatus for directly bonding wafers using the same and a method of bonding wafers in the wafer bonding apparatus.

2. DESCRIPTION OF THE RELATED ART

A chip/wafer stack technology is widely used to increase chip density and performance of a semiconductor package.

Using chip/wafer stack technology, a pair of silicon wafers is generally bonded to each other by pressurization. Minute electronic circuits are formed on the wafers by various semiconductor processes and the pair of wafers is loaded onto a lower chuck and an upper chuck, respectively, of a wafer bonding apparatus. The upper chuck is then forced to move downwards to the lower chuck.

In a conventional bonding apparatus, the upper wafer is secured to the upper chuck by a vacuum which applies a securing vacuum pressure to a peripheral portion of the upper wafer through the upper chuck. Then, a bonding pressure is applied to a central portion of the upper wafer through the upper chuck until the central portion of the upper wafer makes contact with a central portion of the lower wafer. Since the securing vacuum pressure gets turned off when the central portion of the upper wafer makes contact with the central portion of the lower wafer, the bonding of the upper wafer and the lower wafer initiates from the center portions thereof.

In this case, while the central portions of the upper and the lower wafers are forcibly bonded to each other by the bonding pressure (hereinafter, referred to as 'central bonding'), the peripheral portions of the upper and the lower wafers are naturally bonded to each other by gravity and the restoring force of the wafers (hereinafter, referred to as 'peripheral bonding').

In the peripheral bonding of the upper and the lower wafers, since the central portion of the upper wafer is forcibly deformed when bonding with the lower wafer while the peripheral portion of the upper wafer is still secured to the upper chuck, a resilient energy is accumulated at the upper wafer and is maximized at the moment when the central bonding is initiated and the securing vacuum pressure is turned off. When the peripheral portion of the upper wafer is separated from the upper chuck by the release of the securing vacuum pressure, the upper wafer falls downwards toward the lower wafer by gravity along with an oscillation caused by the resilient energy.

In this case, the conventional bonding process may be performed in a bonding time which is not sufficient to restore the original shape of the upper wafer, and thus, the deformed upper wafer tends to bond to the lower wafer. The bonding of the deformed upper wafer to the lower wafer can then cause a misalignment between the upper wafer and the lower wafer. Furthermore, in the conventional bonding process, the bonding time is controlled by the elasticity of the upper wafer and the distance between the upper and the lower wafers. Therefore, a bonding time to permit the upper wafer to be restored into its original shape may not be accurately determined. In addition, when the central portion of the lower wafer is protruded upwards and the lower wafer is deformed into a convex form in a process of controlling the bonding time between the upper and the lower wafers, the air around the contact portion of the concave-shaped upper wafer and the convex-shaped lower wafer is squeezed out from between the central portions of the upper and the lower wafers toward their peripheral portions. Thus, air vapor may be condensed onto surfaces of the peripheral portions of the upper and the lower wafers, and cause bubble defects in the bonding process.

SUMMARY

According to exemplary embodiments of the inventive concept, there is provided a wafer bonding apparatus including: a lower chuck to which a lower wafer is secured at a peripheral portion of the lower chuck; an upper chuck to which an upper wafer is secured; a bonding initiator for pressuring a central portion of the upper wafer until the central portion of the upper wafer reaches a central portion of the lower wafer, thereby initiating a bonding process of the upper and the lower wafers by deforming the upper wafer; and a bonding controller for controlling a bonding speed between a peripheral portion of the upper wafer and a peripheral portion of the lower wafer such that the upper wafer becomes un-deformed prior to bonding the peripheral portion of the upper wafer and the peripheral portion of the lower wafer.

According to exemplary embodiments of the inventive concept, there is provided a wafer bonding system including: a bonding buffer for securing an upper wafer to an upper chuck and a lower wafer to a lower chuck such that the upper wafer and the lower wafer are aligned with each other; and a bonding apparatus in which the upper chuck combined with the upper wafer and the lower chuck combined with the lower wafer are arranged such that the upper chuck and the lower chuck have a common central axis and the upper and the lower wafers are bonded into a bond wafer, wherein the bonding apparatus includes: a bonding initiator for pressuring a central portion of the upper wafer until the central portion of the upper wafer reaches a central portion of the lower wafer, thereby initiating a bonding process of the upper and the lower wafers by deforming the upper wafer; and a bonding controller for controlling a bonding speed between a peripheral portion of the upper wafer and a peripheral portion of the lower wafer such that the upper wafer becomes un-deformed prior to bonding the peripheral portion of the upper wafer and the peripheral portion of the lower wafer.

According to exemplary embodiments of the inventive concept, there is provided a wafer bonding apparatus including: a first chuck having a first wafer disposed thereon; a second chuck having a second wafer disposed thereon; a bonding initiator for moving a central portion of the second wafer to contact a central portion of the first wafer, wherein the second wafer is deformed when it is moved to contact the central portion of the first wafer; and a bonding controller for moving the central portion of the second wafer back towards the second chuck prior to bonding a peripheral portion of the second wafer and a peripheral portion of the first wafer.

BRIEF DESCRIPTION OF THE DRAWINGS

The above and other features of the inventive concept will become more apparent by describing in detail exemplary embodiments thereof with reference to the accompanying drawings of which:

FIG. 3 is a cross sectional view illustrating an upper chuck of the wafer bonding apparatus shown in FIG. 1;

FIGS. 11A and 11B are cross sectional views illustrating processing steps for securing the wafers to the upper chuck and the lower chuck in the wafer bonding system shown in FIG. 9 in accordance with an exemplary embodiment of the inventive concept;

FIGS. 13A, 13B, 13C and 13D are cross sectional views illustrating processing steps for the method of bonding wafers shown in FIG. 12.

DETAILED DESCRIPTION OF THE EMBODIMENTS

Figure 1:
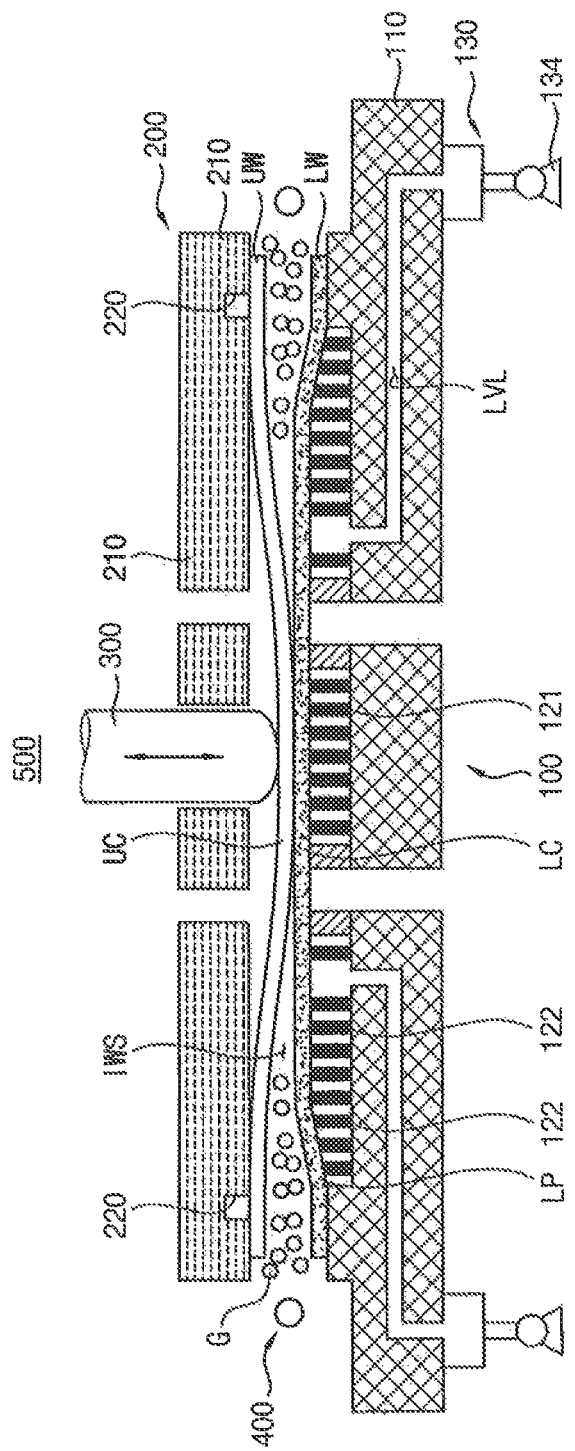
FIG. 1 is a structural view illustrating a wafer bonding apparatus in accordance with an exemplary embodiment of the inventive concept.

Reference will now be made to exemplary embodiments of the inventive concept, which are illustrated in the accompanying drawings, wherein like reference numerals may refer to like components.

FIG. 1 is a structural view illustrating a wafer bonding apparatus in accordance with an exemplary embodiment of the inventive concept.

Referring to FIG. 1, a wafer bonding apparatus 500 in accordance with an exemplary embodiment of the inventive concept may include a lower chuck 100 to which a lower wafer LW may be secured at a peripheral portion thereof, an upper chuck 200 to which an upper wafer UW may be secured, and a bonding initiator 300 for pressuring a central portion of the upper wafer UW until the central portion of the upper wafer UW reaches a central portion of the lower wafer LW, thereby initiating a bonding process of the upper wafer UW and the lower wafer LW with an elastic deformation of the upper wafer UW. The wafer bonding apparatus 500 may further include a bonding controller 400 for controlling a bonding speed between a peripheral portion of the upper wafer UW and a peripheral portion of the lower wafer LW such that the elastic deformation of the upper wafer UW may be released prior to a bonding between the peripheral portion of the upper wafer UW and the peripheral portion of the lower wafer LW.

The upper wafer UW and the lower wafer LW may include a processed silicon wafer having a plurality of integrated circuit (IC) devices and wirings that may be manufactured by semiconductor processes or may include a bare silicon wafer. The upper wafer UW and the lower wafer LW may include any other semiconductor substrates as well as the silicon wafer.

The lower chuck 100 may have a shape corresponding to the lower wafer LW and may be transformed according to the transformation of the lower wafer LW. In the present exemplary embodiment, the lower wafer LW is secured to the lower chuck 100 in such a way that the lower wafer LW may be transformed into a convex curve. Thus, the lower chuck 100 may include a circular flat plate having a flat zone corresponding to the lower wafer LW and the shape of the lower wafer LW may force the lower chuck 100 to have the convex shape.

Figure 2A:
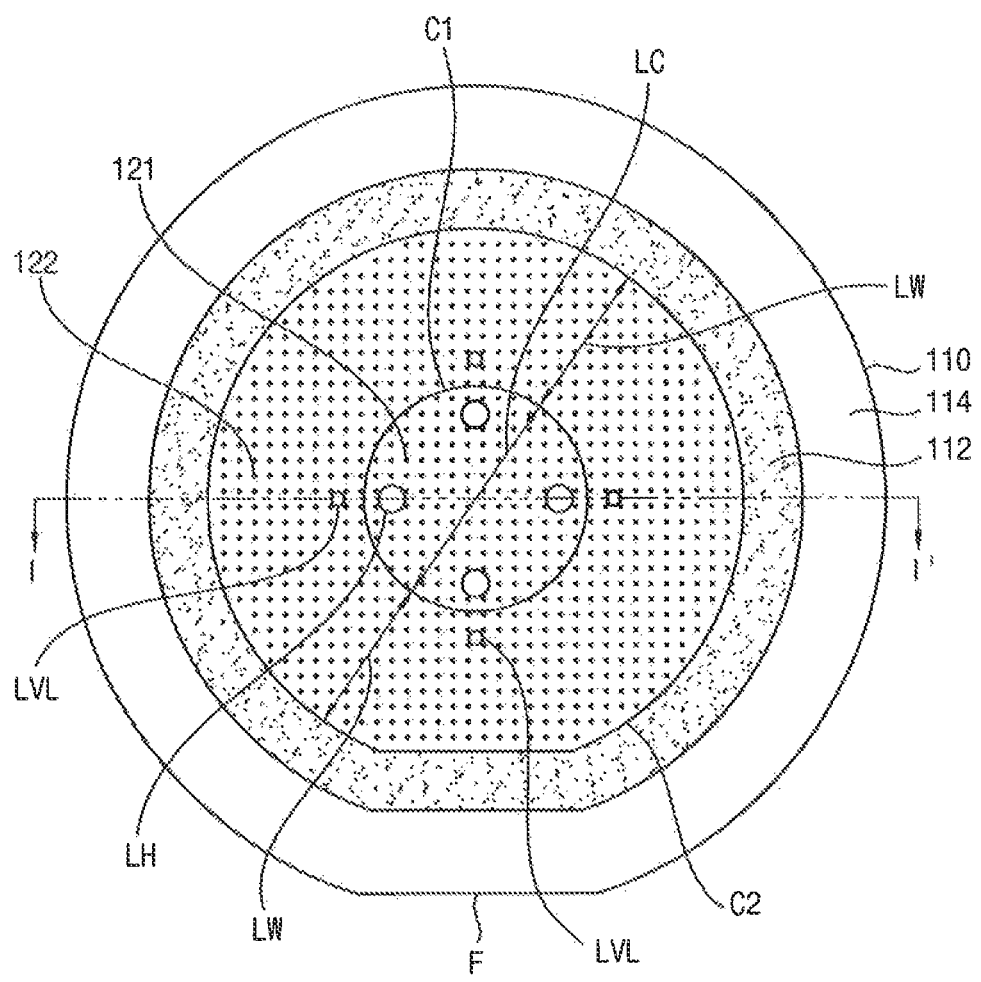
FIG. 2A is a plan view illustrating a lower chuck of the wafer bonding apparatus shown in FIG. 1.
Figure 2B:
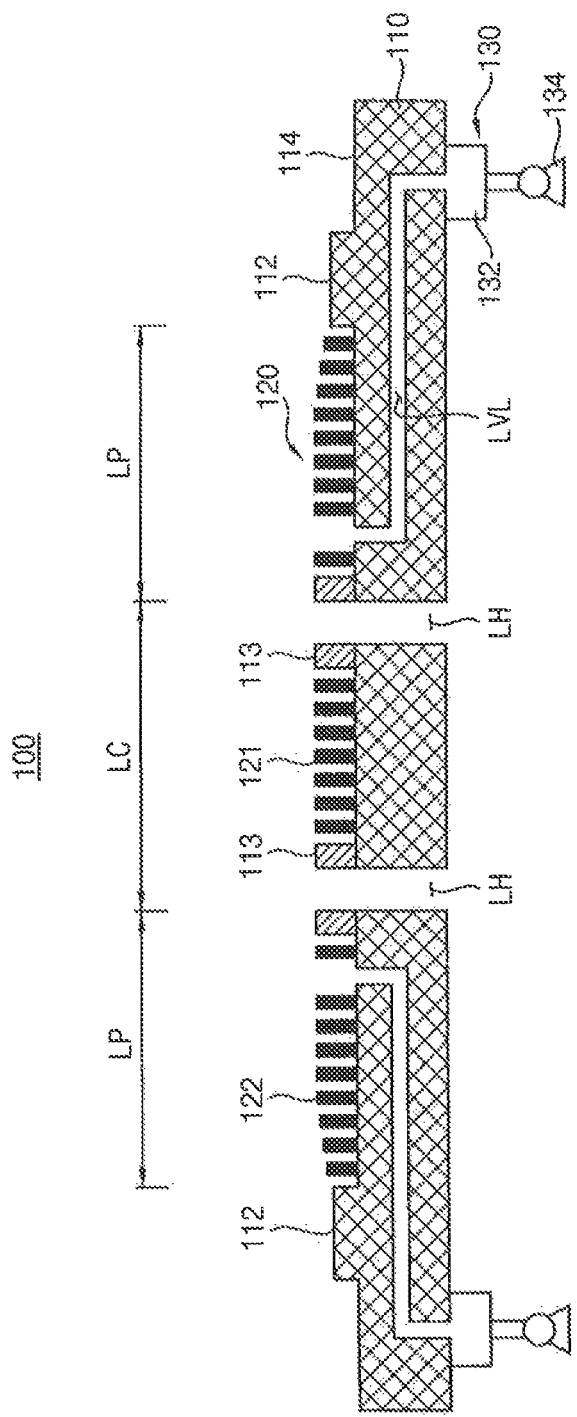
FIG. 2B is a cross sectional view cutting along a line I-I' of the lower chuck shown in FIG. 2A.

FIG. 2A is a plan view illustrating the lower chuck of the wafer bonding apparatus 500 shown in FIG. 1, and FIG. 2B is a cross sectional view cutting along a line I-I' of the lower chuck 100 shown in FIG. 2A.

Referring to FIGS. 2A and 2B, the lower chuck 100 may include a lower body 110, a plurality of support pins 120 protruded from the lower body 110 upwards in such a configuration that the heights of the support pins 120 may increase step by step from a peripheral portion to a central portion of the lower body 110 and a lower wafer holder 130 penetrating through the lower body 110 and securing the lower wafer LW to the support pins 120.

The lower body 110 may comprise insulation materials such as a silicon carbide and may be shaped into a wafer. Thus, a linear portion F corresponding to a flat zone of the wafer may be provided with the lower body 110 and may function as an aligning reference when the lower wafer LW is aligned with the lower chuck 100.

For example, the lower body 110 may be divided into an inner portion and an outer portion by a stepped portion 112. The support pins 120 may be arranged on the inner portion of the lower body 110 and the outer portion of the lower body 110 may be provided as a spare area for an additional use in the process of bonding the upper and the lower wafers UW and LW.

The stepped portion 112 may be protruded from an upper surface of the lower body 110 to a predetermined height and may be shaped into a ring extending along a circumferential line of the lower body 110.

A plurality of support pins 120 may be arranged on the upper surface of the inner portion of the lower body 110 and may support the lower wafer LW. For example, the support pins 120 may be arranged on the inner portion of the lower body 110 in such a way that the height of the support pin 120 may increase from a peripheral portion to a central portion of the lower body 110. Thus, the support pin 120 close to the stepped portion 112 may have the minimal height and the support pin 120 close to the central portion of the lower body 110 may have the maximum height.

A plurality of lift holes LH may be arranged at the central portion of the lower body 110 and a lift guide 113 may be arranged around each lift hole LH, so that each lift hole LH may be enclosed by the lift guide 113. A lift may penetrate through the lift hole LH and may load the lower wafer LW onto the lower chuck 100.

In the present exemplary embodiment, four lift holes LH and four lift guides 113 may be arranged along a first circumferential line C1 having the same radius from the center of the lower body 110. However, more or less than four lift holes LH and four lift guides 113 may be provided with the lower body 110.

A plurality of first support pins 121 may be arranged on a first area of the lower body 110 defined by the first circumferential line C1 in such a configuration that the first support pins 121 may have the same height. Thus, the central portion of the lower wafer LW may be secured to the lower chuck 100 in a flat shape since upper surfaces of the first support pins 121 may have the same level. Hereinafter, the central portion of the lower wafer LW having a flat shape may be referred to as lower center portion LC. The central portion of the upper wafer UW may be referred to as an upper center portion UC.

A plurality of second support pins 122 may be arranged on a second area of the lower body 110 between the first circumferential line C1 and the stepped portion 112 in such a configuration that the height of the second support pins 122 may increase toward the central portion of the lower body 110. In other words, the support pins 122 close to the stepped portion 112 may have the minimal height and the support pins 122 close to the lift guide 113 may have the maximal height. A second circumferential line C2 may be disposed around the second support pins 122. In FIG. 2A, for example, reference numeral 114 may refer to a portion of the lower body 110 between the second circumferential line C2 and an edge of the lower body 110.

Thus, the lower wafer LW may be secured to the lower chuck 100 in a curved shape since the lower wafer LW may be supported by the second support pins 122 having different heights. Hereinafter, the peripheral portion of the lower wafer LW having a curve shape may be referred to as lower peripheral portion LP.

Thus, the surface profile of the lower peripheral portion LP may be varied according to the surface profile of the second support pins 122. In other words, the profile of the peripheral portion of the lower wafer LW may be determined by the height variation of the second support pins 122.

A lower void line LVL may be arranged in the second area of the lower body 110 and the vacuum pressure for securing the lower wafer LW to the lower chuck 100 may be applied to the lower wafer LW via the lower void line LVL.

For example, the lower wafer holder 130 may include a vacuum sucker for sucking the lower wafer LW by the vacuum pressure that may be applied to the rear surface of the lower wafer LW through the lower void line LVL.

The lower void line LVL may be connected to a vacuum supply line 132 that may be connected to a single vacuum generator 134, so that the vacuum pressure generated from the vacuum generator 134 may be applied to the lower wafer LW via the vacuum supply line 132 and the lower void line LVL.

Thus, the lower wafer LW may be sucked by the vacuum pressure at the second area and may be secured to the lower chuck 100 in such a way that the lower wafer LW may be supported by the first and the second support pins 121 and 122. Thus, the surface profile of the lower wafer LW may be deformed along an area defined by the upper surfaces of the support pins 120. For example, the surface of the lower wafer LW may be deformed into a convex curve CC1 (see FIG. 13A) protruding upwards to the upper wafer UW.

While the present exemplary embodiment discloses that the vacuum pressure is applied to the lower wafer LW around the lower central portion LC, the vacuum pressure may be applied to various portions of the lower wafer LW as long as the internal stresses and strains of the lower wafer LW may be minimized. In addition, the structures of the lower wafer holder 130 may also be varied according to the connection position of the lower void line LVL and the vacuum supply line 132 and the vacuum portion of the lower wafer LW to which the vacuum pressure may be applied.

FIG. 3 is a cross sectional view illustrating the upper chuck 200 of the wafer bonding apparatus 500 shown in FIG. 1.

Referring to FIG. 3, the upper chuck 200 may include an upper body 210 and an upper wafer holder 220. A penetration hole PH may be arranged at a central portion of the upper body 210 and the bonding initiator 300 may be disposed in the penetration hole PH. The upper wafer holder 220 may be arranged at the peripheral portion of the upper body 210.

The upper body 210 may also comprise insulation materials such as a silicon carbide and may be shaped into a wafer just like the lower body 110. Thus, a linear portion corresponding to a flat zone of the upper wafer UW may be provided with the upper body 210 and may function as an aligning reference when the upper wafer UW is aligned with the upper chuck 200.

For example, the bonding initiator 300 may selectively penetrate through the upper body 210 at the central portion thereof and a bonding pressure may be applied to the central portion of the upper wafer UW by the bonding initiator 300. The upper wafer holder 220 may be arranged at a peripheral portion of the upper body 210 and the upper wafer UW may be secured to the upper body 210 by the upper wafer holder 220.

The upper wafer holder 220 may include a vacuum sucker like the lower wafer holder 130. Thus, the vacuum pressure may be applied to a rear surface of the upper wafer UW and the rear surface of the upper wafer UW may be sucked up toward the upper body 210 to secure the upper wafer UW to the upper body 210.

The vacuum pressure for securing the upper wafer UW to the upper body 210 may be generated by the vacuum generator 134 of the lower chuck 100 or by an additional vacuum generator only for the upper wafer holder 220. An upper void line may be provided in the upper body 210 such that the upper void line may be connected with a vacuum supply line. In the present exemplary embodiment, the vacuum supply line may be arranged at a side of the upper body 210 and may be connected to the vacuum generator.

A plurality of lift holes LH may be arranged around the penetration hole PH. A lifter may extend through the upper body 210 and may lift the upper wafer UW toward the upper body 210.

When the upper wafer UW is lifted up close to the upper body 210 by the lifter, the upper wafer holder 220 may secure the upper wafer UW to the upper body 210 such that the upper wafer UW is secured to the upper body 210 in a flat shape.

When the lower chuck 100 to which the lower wafer LW is secured and the upper chuck 200 to which the upper wafer UW is secured are aligned with each other at a sufficient accuracy, the bonding initiator 300 may move downwards through the penetration hole PH and may pressurize the central portion of the upper wafer UW. Thus, the central portion of the upper wafer UW may be spaced apart from the upper body 210 while the peripheral portion of the upper wafer UW may still be secured to the upper body 210 by the upper wafer holder 220. Therefore, the upper wafer UW may be deformed in such a way that the central portion of the upper wafer UW may be deflected into a concave curve CC2 (see FIG. 13B) protruding toward the lower wafer LW. The concave curve CC2 of the central portion of the upper wafer UW may make contact with the convex curve CC1 of the central portion of the lower wafer LW as the bonding initiator 300 pressurizes the central portion of the upper wafer UW.

For example, the bonding initiator 300 may include a slender rod driven by an external power source such as an electric motor and a hydraulic power.

The peripheral portion of the upper wafer UW may still be secured to the upper body 210 by the upper wafer holder 220 to the moment when the lower wafer LW and the upper wafer UW may make contact with each other at the central portions of the convex curve part of the lower wafer LW and the concave curve part of the upper wafer UW. Thus, the peripheral portions of the upper wafer UW and the lower wafer LW may be spaced apart from each other, so that an inter-wafer gap space IWS may be provided between the peripheral portions of the upper wafer UW and the lower wafer LW. Since the upper and the lower wafers UW and LW may be make contact with each other by virtue of their concave and convex shapes, the size of the inter-wafer gap space IWS may be enlarged from the central portions to the peripheral portions of the upper and the lower wafers UW and LW. In addition, an elastic deformation may be generated at both of the upper wafer UW and the lower wafer LW.

The vacuum pressure of the upper wafer holder 220 may be stopped at the moment when the central portions of the upper wafer UW and the lower wafer LW make contact with each other. Thus, the peripheral portion of the upper wafer UW may be separated from the peripheral portion of the upper body 210 and may fall down toward the peripheral portion of the lower wafer LW together with oscillations for releasing the elastic deformation of the upper wafer UW. Therefore, the peripheral portion of the upper wafer UW may be bonded to the peripheral portion of the lower wafer LW.

In this case, the bonding speed of the peripheral portion of the upper wafer UW to the peripheral portion of the lower wafer LW may be controlled by the bonding controller 400 such that the bonding time between the peripheral portions of the upper wafer UW and the lower wafer LW may be longer than the time for releasing the elastic deformation of the upper wafer UW. Thus, the peripheral portion of the upper wafer UW may be bonded to the peripheral portion of the lower wafer LW after the peripheral portion of the upper wafer UW is sufficiently restored to its original shape. Therefore, the alignment between the upper wafer UW and the lower wafer LW before the bonding process may be maintained in the bonding process. In other words, the bonding process between the upper wafer UW and the lower wafer LW may be conducted with sufficiently high alignment accuracy.

Since the peripheral portion of the upper wafer UW may fall down toward the peripheral portion of the lower wafer LW, the bonding speed of the peripheral portion of the upper wafer UW may be controlled just by changing the configuration of the inter-wafer gap space IWS.

In the present exemplary embodiment, filling gases G may be filled into the inter-wafer gap space IWS to impede the peripheral portion of the upper wafer UW from falling. In other words, the filling gas G in the inter-wafer gap space IWS may prevent the peripheral portion of the upper wafer UW from falling, thereby reducing the bonding speed of the peripheral portion of the upper wafer UW and, as a result, the bonding time for bonding the peripheral portion of the upper wafer UW to the peripheral portion of the lower wafer LW may be extended. Thus, the bonding time may be sufficiently extended such that the elastic deformation of the upper wafer UW may be sufficiently released and the peripheral portion of the upper wafer UW may be restored to its original shape just by controlling the density of the filling gases G in the inter-wafer gap space IWS.

In the present exemplary embodiment, the bonding controller 400 may include a gas injector 410 for directly injecting the filling gases G into the inter-wafer gap space IWS.

For example, the gas injector 410 may be connected to a fixed portion such as a ceiling of a bonding chamber (910 in FIG. 9) by a moving wire. Thus, the gas injector 410 may move downwards along the moving wire from the ceiling to a position apart from the upper wafer UW and the lower wafer LW which faces the inter-wafer gap space IWS. When completing the gas injection, the gas injector 410 may move upwards by the moving wire.

Figure 4:
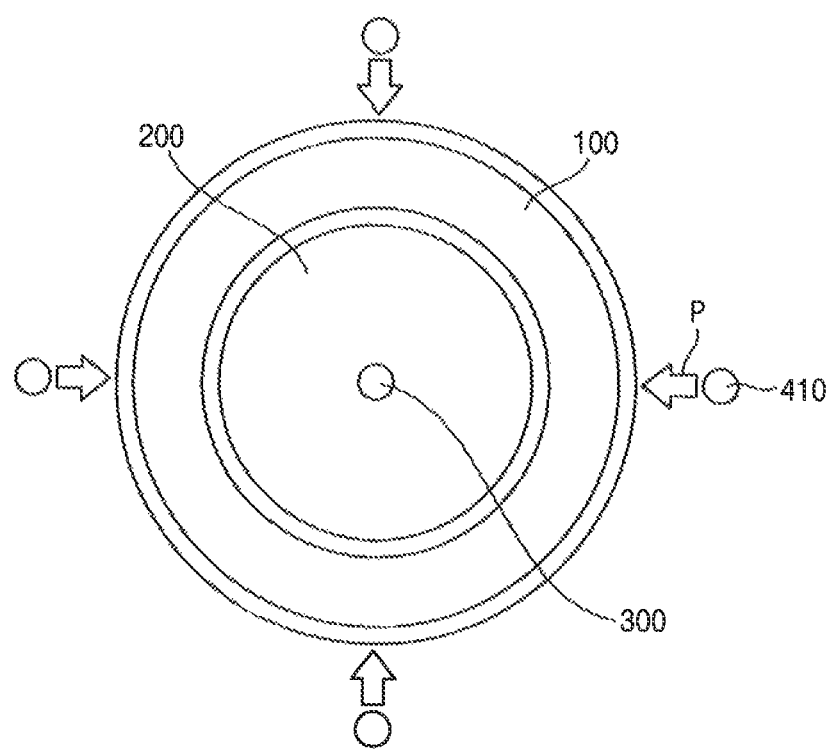
FIG. 4 is a structural view illustrating the arrangement of a gas injector with respect to an upper wafer and a lower wafer of the wafer bonding apparatus shown in FIG. 1.

FIG. 4 is a structural view illustrating the arrangement of the gas injector 410 with respect to the upper wafer UW and the lower wafer LW.

Referring to FIG. 4, the inter-wafer gap space IWS may be an open space exposed to its surroundings and the gas injector 410 may be arranged around the upper and the lower wafers UW and LW. The gas injector 410 may be spaced apart from the upper and the lower wafers UW and LW such that the gas injector 410 may face the inter-wafer gap space IWS.

A plurality of the gas injectors 410 may be arranged around the inter-wafer gap space IWS at the same interval. For example, four gas injectors may be arranged around the inter-wafer gap space IWS at the positions of four different angles of 0°, 90°, 180° and 270°.

Thus, the filling gases G may be efficiently injected into the inter-wafer gap space IWS by the four gas injectors 410. This way, the filling gas G may be filled in the inter-wafer gap space IWS at a predetermined pressure. The filling gases G in the inter-wafer gap space IWS may prevent the upper portion of the upper wafer UW from falling down, thereby reducing the bonding speed of the peripheral portion of the upper wafer UW to the peripheral portion of the lower wafer LW.

For example, the filling gases G may be under a pressure of about 0.5 atm to about 1.5 atm in the inter-wafer gap space IWS. When the inter-wafer gap space IWS has a vacuum state, the peripheral portion of the upper wafer UW may fall down so rapidly such that it is bonded to the peripheral portion of the lower wafer LW before the elastic deformation of the upper wafer UW is sufficiently released. Therefore, the alignment between the upper wafer UW and the lower wafer LW may be deteriorated in the bonding process. In contrast, when the inner pressure of the inter-wafer gap space IWS is excessively high, the bonding speed may be so slow that an overall efficiency of the bonding process may be significantly reduced.

Therefore, the inner pressure of the inter-wafer gap space IWS is controlled to a near-atmospheric pressure to prevent an excessive deterioration of the bonding efficiency so that the elastic deformation of the upper wafer UW may be sufficiently released. For example, the inter-wafer gap space IWS may be under the pressure of about 0.5 atm to about 1.5 atm.

Since the filling gas G in the inter-wafer gap space IWS may be controlled just to prevent the peripheral portion of the upper wafer UW from falling, the inner pressure of the inter-wafer gap space IWS may be varied according to the surface characteristics and shape of the upper wafer UW.

Since the filling gas G may contact the upper and the lower wafers UW and LW in the inter-wafer gap space IWS, a chemical reaction between the filling gas G and the upper and the lower wafers UW and LW should be prevented. For that reason, the filling gas G may include an inactive gas such as argon (Ar) gas, nitrogen (N2) gas and helium (He) gas. In addition, oxygen (O2) gas may also be used as the filling gas G, because an insulation layer may be formed on the upper and the lower wafers UW and LW by the chemical reaction between the oxygen (O2) gas and the silicon wafer.

Since the inter-wafer gap space IWS may be enlarged from the central portion to the peripheral portion of the upper and the lower wafers UW and LW, the air between the contact surfaces of the upper and the lower wafers UW and LW may be squeezed out from the central portion toward the peripheral portion of the upper and lower wafers UW and LW under an adiabatic expansion of air. Thus, the vapor in the air may be condensed onto surfaces of the upper and the lower wafers UW and LW, thereby causing bonding defects between the upper and the lower wafers UW and LW.

For that reason, the filling gas G may include an inactive gas having a negative Joule-Thomson coefficient. When the Joule-Thomson coefficient of the filling gas G is negative, the air may be heated by the adiabatic expansion to thereby prevent vapor condensation in the inter-wafer gap space IWS. When helium (He) gas having a negative Joule-Thomson coefficient is used as the filling gas G, the bonding speed of the upper wafer UW to the lower wafer LW may be sufficiently reduced without vapor generation. Thus, the upper wafer UW may be bonded to the lower wafer LW without any substantial elastic deformations.

Figure 5:
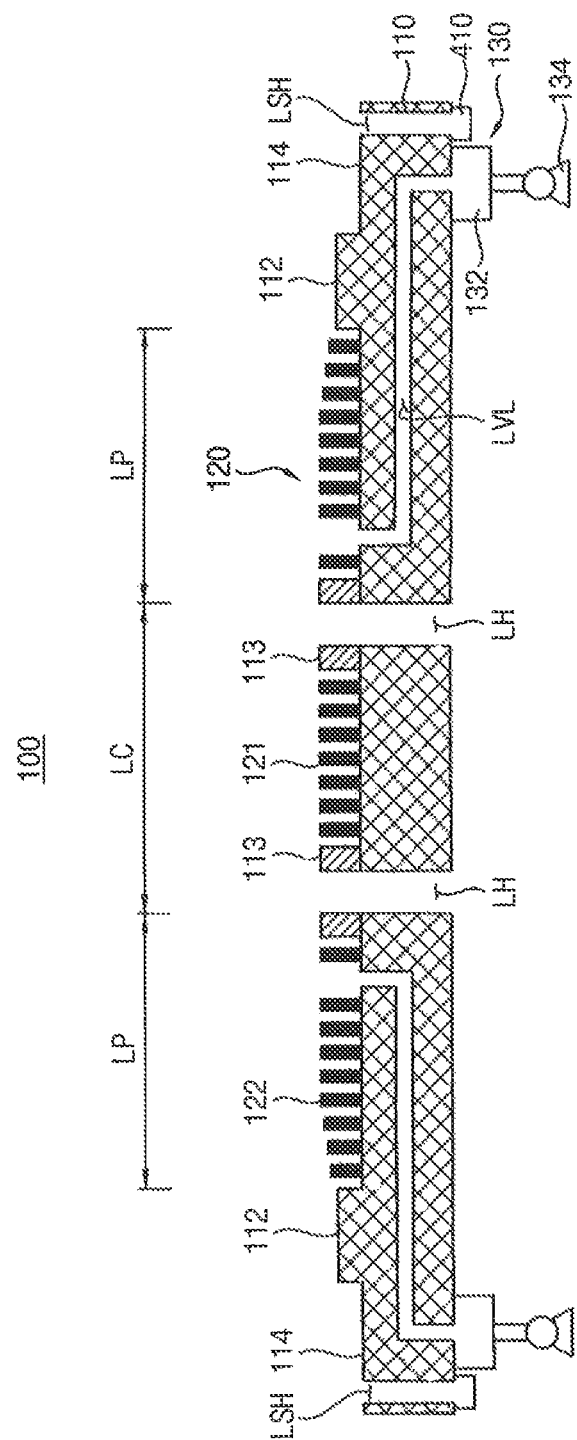
FIG. 5 is a cross sectional view illustrating a modification of the lower chuck shown in FIG. 2B in accordance with an exemplary embodiment of the inventive concept.
Figure 6:
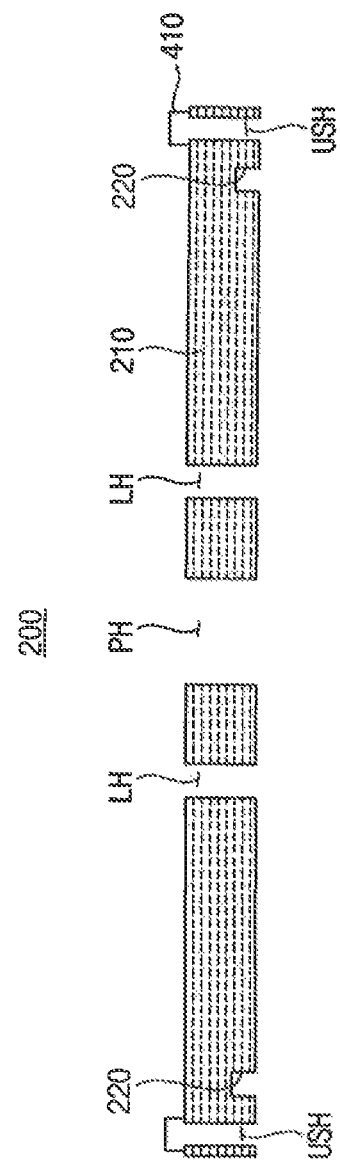
FIG. 6 is a cross sectional view illustrating a modification of the upper chuck shown in FIG. 3 in accordance with an exemplary embodiment of the inventive concept.

FIG. 5 is a cross sectional view illustrating a modification of the lower chuck 100 shown in FIG. 2B in accordance with an exemplary embodiment of the inventive concept, and FIG. 6 is a cross sectional view illustrating a modification of the upper chuck 200 shown in FIG. 3 in accordance with an exemplary embodiment of the inventive concept. In FIGS. 5 and 6, the lower chuck 100 and the upper chuck 200 have substantially the same structures as the lower chuck and the upper chuck shown in FIGS. 2B and 3, except that a gas supply hole for supplying the filling gas G may be provided with the lower chuck 100 and the upper chuck 200. Thus, the same reference numerals in FIGS. 5 and 6 denote the same elements in FIGS. 2A and 3, and any further detailed descriptions on the same elements will be omitted.

Referring to FIGS. 5 and 6, a lower gas supply hole LSH may be provided at an edge of the lower body 110 and an upper gas supply hole USH may be provided at an edge of the upper body 210.

In this case, the gas injector 410 may be arranged on the upper surface of the upper body 210 and on the rear surface of the lower body 110 such that the gas injector 410 may be inserted into the lower gas supply hole LSH and the upper gas supply hole USH, respectively. Thus, the gas injector 410 may be assembled to the lower body 110 and the upper body 210 without any fasteners or securing members.

The filling gases G may flow to the gas injector 410 through a flexible flow line from a gas reservoir and may be injected into the inter-wafer gap space IWS through the lower gas supply hole LSH and the upper gas supply hole USH.

When the gas injector 410 is positioned around the upper and the lower wafers UW and LW and the filling gases G are directly injected into the inter-wafer gap space IWS, the injection efficiency of the filling gas G may be relatively poor because the size of the inter-wafer gap space IWS may be relatively small. In other words, the gas injector 410 may not be aligned with the inter-wafer gap space IWS.

However, when the gas injector 410 is connected to the lower gas supply hole LSH and the upper gas supply hole USH, the filling gases G may be supplied into the inter-wafer gap space IWS without any losses, and thus, the injection efficiency of the filling gases G may be sufficiently high.

While the present exemplary embodiment discloses that the gas supply hole is provided in both of the upper and the lower bodies 210 and 110, the gas supply hole may also be provided in just one of the upper and the lower bodies 210 and 110.

Figure 7:
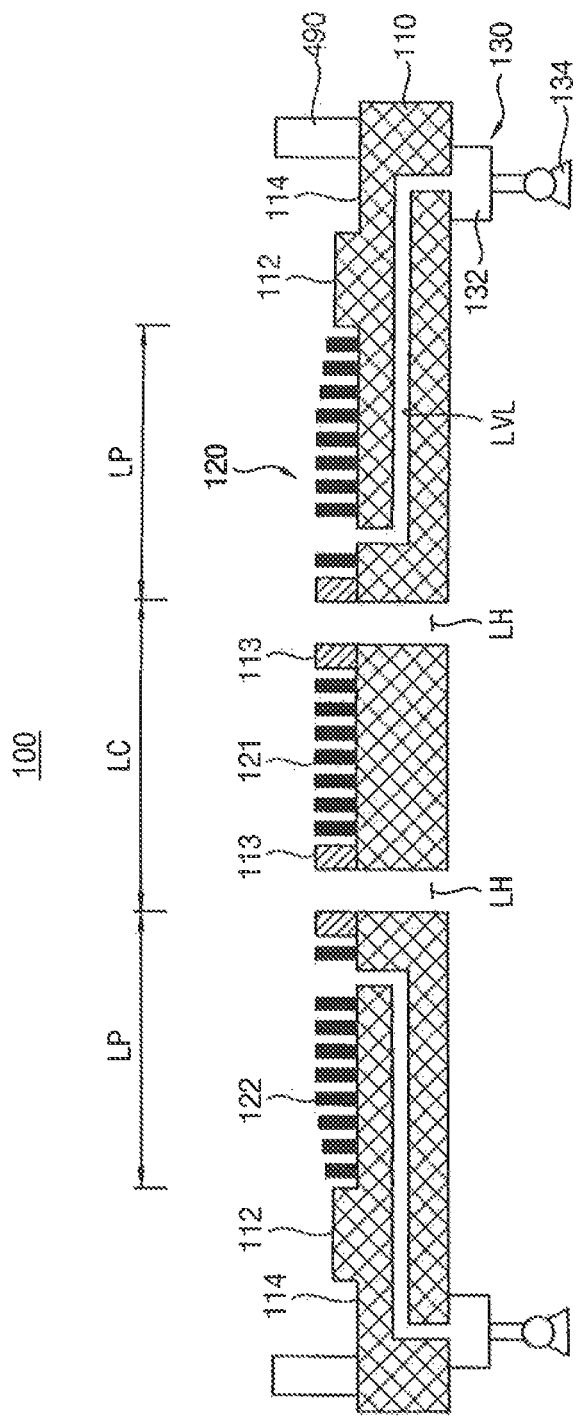
FIG. 7 is a cross sectional view illustrating another modification of the lower chuck shown in FIG. 2B in accordance with an exemplary embodiment of the inventive concept.
Figure 8:
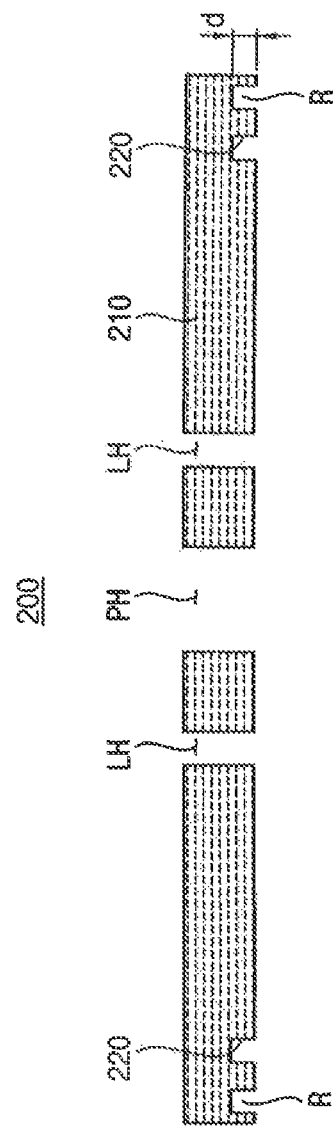
FIG. 8 is a cross sectional view illustrating another modification of the upper chuck shown in FIG. 3 in accordance with an exemplary embodiment of the inventive concept.

FIG. 7 is a cross sectional view illustrating another modification of the lower chuck 100 shown in FIG. 2B in accordance with an exemplary embodiment of the inventive concept. FIG. 8 is a cross sectional view illustrating another modification of the upper chuck 200 shown in FIG. 3 in accordance with an exemplary embodiment of the inventive concept. In FIGS. 7 and 8, the lower chuck 100 and the upper chuck 200 have substantially the same structures as the lower chuck 100 and the upper chuck 200 shown in FIGS. 5 and 6, except that a shielding wall and a shielding recess gas may be provided with the lower chuck 100 and the upper chuck 200 for separating the inter-wafer gap space IWS from its surroundings. Thus, the same reference numerals in FIGS. 7 and 8 denote the same elements in FIGS. 2A and 3 or FIGS. 5 and 6, and any further detailed descriptions on the same elements will be omitted.

Referring to FIGS. 7 and 8, a shielding wall 490 may be provided on the edge portion of the lower body 110 and a shielding recess R may be provided on the edge portion of the upper body 210 corresponding to the shielding wall 490.

When the alignment of the lower chuck 100 and the upper chuck 200 is completed, one of the lower chuck 100 and the upper chuck 200 may move to the rest in such a way that the shielding wall 490 may be inserted into the shielding recess R. Accordingly, the inter-wafer gap space IWS may be enclosed by the shielding wall 490 and separated from its surroundings. Thus, the inter-wafer gap space IWS may be formed as a closed space by the shielding wall 490. The shielding recess R may have a sufficient depth d for receiving the shielding wall 490 when the upper wafer UW and the lower wafer LW are contacted at their central portions.

In addition, an opening may be further provided with the shielding wall 490 and the gas injector 410 may be connected to the opening. Thus, the filling gases G may be supplied into the closed inter-wafer gap space IWS from the gas injector 410 through the opening.

For example, when the gas injector 410 is connected to the upper and lower gas supply holes USH and LSH, the filling gases G may be efficiently supplied into the closed inter-wafer gap space IWS and the inner pressure of the inter-wafer gap space IWS may rapidly reach an expected pressure.

In the wafer bonding apparatus according to an exemplary embodiment of the inventive concept, the filling gases G may be filled into the inter-wafer gap space IWS to a predetermined inner pressure. Thus, the peripheral portion of the upper wafer UW may be prevented from falling down by the filling gases G, thereby reducing the falling speed of the upper wafer UW. Thus, the bonding process between the peripheral portion of the upper wafer UW and the peripheral portion of the lower wafer LW may be conducted after the elastic deformation of the upper wafer UW is sufficiently released, thereby sufficiently preventing misalignment between the upper wafer UW and the lower wafer LW in the bonding process.

In addition, an inactive gas having a negative Joule-Thomson coefficient may be used as the filling gas G. Thus, in the boding process between the upper wafer UW and the lower wafer LW, vapor condensation due to the adiabatic expansion of air may be sufficiently prevented on the surfaces of the upper and lower wafers UW and LW in the inter-wafer gap space IWS, even though the size of the inter-wafer gap space IWS may be enlarged from the central portions to the peripheral portions of the upper and lower wafers UW and LW.

Accordingly, the misalignment of the upper and lower wafers UW and LW and the vapor condensation may be minimized in the bonding process.

Hereinafter, a wafer bonding system having the wafer bonding apparatus will be described in detail hereinafter.

Figure 9:
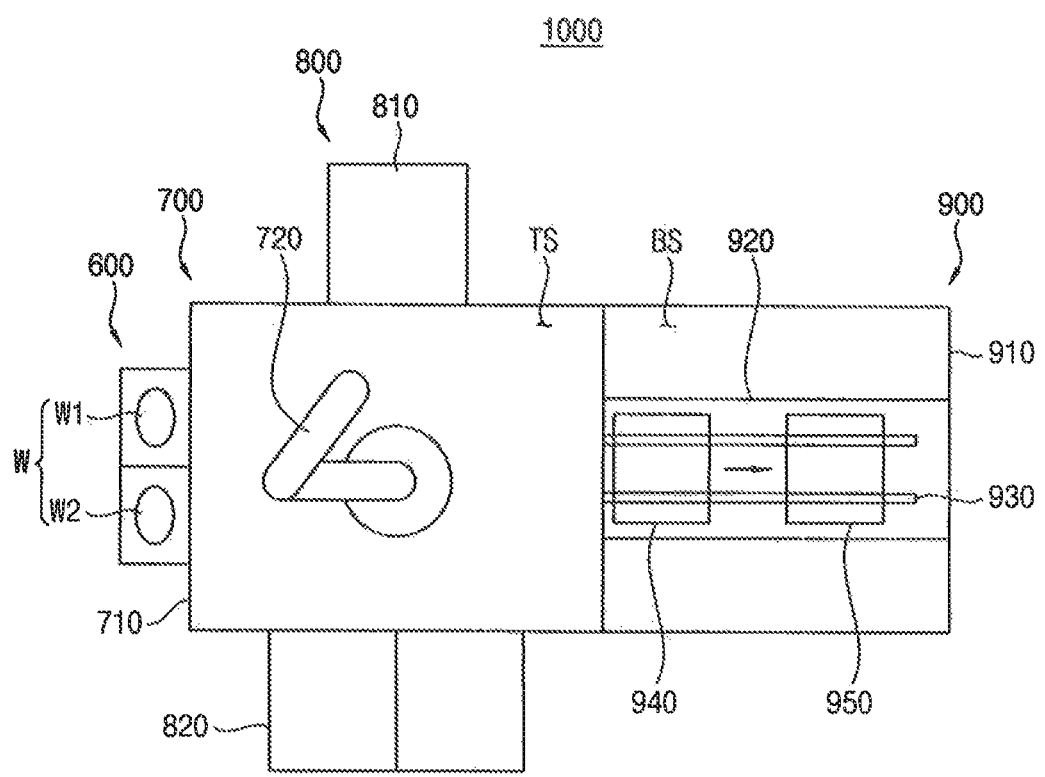
FIG. 9 is a structural view illustrating a wafer bonding system in accordance with an exemplary embodiment of the inventive concept.

FIG. 9 is a structural view illustrating a wafer bonding system in accordance with an exemplary embodiment of the inventive concept. In FIG. 9, a bonding apparatus 950 of a wafer bonding system 1000 may have substantially the same structures as the wafer bonding apparatus 500 as described in detail with reference to FIGS. 1 to 8. In FIGS. 9 to 13D, the same reference numerals may denote the same elements in FIGS. 1 to 8, and any further detailed descriptions on the same elements may be omitted. In the figures that follow reference letter W may be used to refer to a single wafer or a plurality of wafers, for example.

Referring to FIG. 9, a wafer bonding system 1000 in accordance with an exemplary embodiment of the inventive concept may include a loading port 600 for loading and unloading wafers W, a bonding unit 900 for bonding the wafers W and a transfer unit 700 for transferring the wafers W between the loading port 600 and the bonding unit 900. Selectively, the wafer bonding system 1000 may further include a process unit 800 for additionally processing the wafers W before mounting the wafers W to the bonding unit 900.

For example, the loading port 600 may be positioned at a side of the transfer unit 700 and a wafer cassette including a plurality of the wafers W may be positioned on the loading port 600. Then, a transfer arm 720 may extract the wafers W from the wafer cassette individually and may transfer the wafer W the bonding unit 900 and/or the process unit 800.

The wafers W may include a first wafer W1 which may undergo a plurality of semiconductor manufacturing processes and a second wafer W2 which may not undergo any semiconductor manufacturing processes.

Figure 10A:
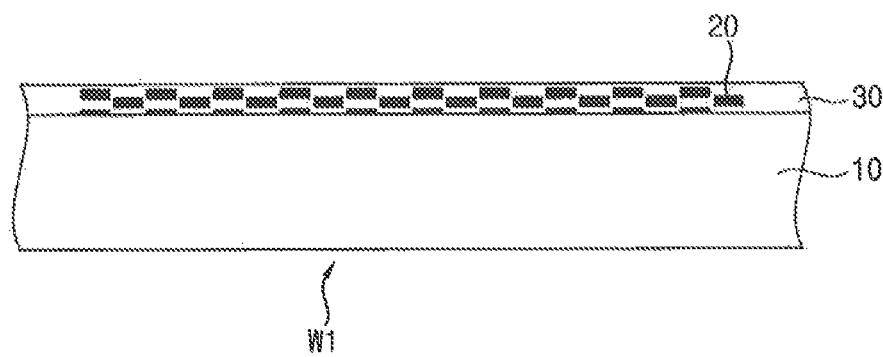
FIGS. 10A and 10B are cross sectional views illustrating wafers that are bonded to each other in the wafer bonding system shown in FIG. 9.
Figure 10B:
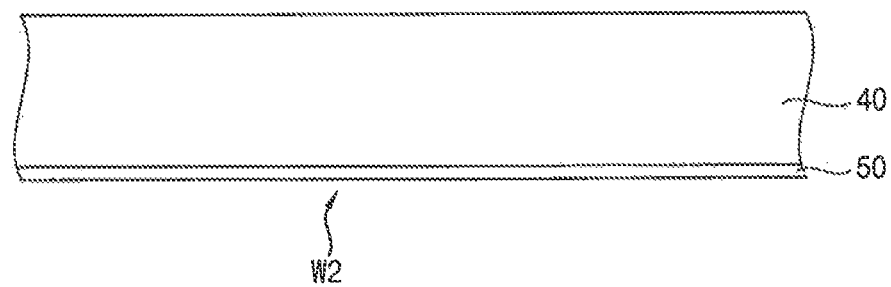

FIGS. 10A and 10B are cross sectional views illustrating the wafers W that are bonded to each other in the wafer bonding system shown 1000 in FIG. 9.

As illustrated in FIGS. 10A and 10B, the first wafer W1 may include a first body 10, a plurality of conductive structures 20 that may be formed on the first body 10 by a plurality of semiconductor manufacturing processes and a passivation layer 30 for covering the conductive structures 20. For example, the conductive structures 20 may include a plurality of integrated circuit (IC) devices and a plurality of wiring structures electrically connected with the IC devices.

In contrast, the second wafer W2 may include a bare wafer just having a second body 40. Selectively, a surface protection layer 50 may be further formed on the second wafer W2 in the process unit 800 before the second wafer W2 is supplied to the bonding unit 900. Thus, the bare wafer of the second wafer W2 may include the second body 40 and the surface protection layer 50.

Referring back to FIG. 9, a transfer chamber 710 may include a solid body shaped into a box and having a closed transfer space TS. Thus, the wafer W in the transfer chamber 710 may be sufficiently protected from its surroundings and any contaminants. The transfer arm 720 may be secured to a bottom of the transfer chamber 710 and may be rotated in the transfer space TS.

An additional process may be selectively performed on the wafer W in the process unit 800 prior to the bonding process in the bonding unit 900. For example, the process unit 800 may include a cleaner 810 for cleaning the wafer W and a plasma processor 820 for treating the wafer W with plasma.

For example, the surface protection layer 50 may be formed on the second body 40 of the second wafer W2 by the plasma treatment in the plasma processor 820 before the second wafer W2 is supplied to the bonding unit 900. In addition, the first and the second wafers W1 and W2 may be cleaned and rinsed in the cleaner 810 to remove surface contaminants from the first and the second wafers W1 and W2 prior to initiating the bonding process in the bonding unit 900.

A pair of the wafers W may be supplied to the bonding unit 900 and may be formed into a bonding wafer BW (see FIG. 13D).

For example, the bonding unit 900 may include a bonding chamber 910 connected to the transfer chamber 710 and having a bonding space BS communicating with the transfer space TS, a base plate 920, a transfer rail 930 on the base plate 920, a bonding buffer 940 and the bonding apparatus 950 secured to the transfer rail 930.

For example, the bonding chamber 910 may be integrally provided with the transfer chamber 710 in one body as a solid structure, and various instruments for bonding the wafers W may be arranged in the bonding chamber 910. For example, the bonding space BS may communicate with the transfer space TS. Thus, the wafer W may be transferred to the bonding space BS by the transfer arm 720 from the loading port 600 and the bonded wafer BW may also be transferred to the loading port 600 via the transfer space TS by the transfer arm 720.

The base plate 920 may include plate structures that may be arranged on a bottom portion and a ceiling portion of the bonding chamber 910 and the transfer rail 930 may be arranged on the base plate 920. The base plate 920 may absorb the motion vibration of the lower chuck 100 and the upper chuck 200. The transfer rail 930 may include a pair of transfer lines on the base plate 920.

The bonding buffer 940 may be arranged at a first end of the transfer rail 930 and the bonding apparatus 950 may be arranged at a second end of the transfer rail 930 opposite to the first end. A wafer W may be secured to the upper chuck 200 and another wafer W may be secured to the lower chuck 100 in the bonding buffer 940 and the bonded wafer BW may be temporarily held in the bonding buffer 940 before transferring back to the loading port 600. The upper wafer UW secured to the upper chuck 200 and the lower wafer LW secured to the lower chuck 100 may be bonded to each other in the bonding apparatus 950 to thereby form the bonded wafer BW. The upper wafer UW and the lower wafer LW may be secured to the upper chuck 200 and the lower chuck 100, respectively, according to the same securing recipes and the same aligning requirements.

The bonding buffer 940 and the bonding apparatus 950 may be connected to each other by the transfer rail 930, so the upper chuck 200 having the upper wafer UW and the lower chuck 100 having the lower wafer LW may be transferred to the bonding apparatus 950 along the transfer rail 930.

A pair of the wafers W may be transferred to the bonding buffer 940 by the transfer arm 720 and one of the wafers W may be secured to the upper chuck 200 and the other of the wafers W may be secured to the lower chuck 100, respectively. Thus, the wafer W secured to the upper chuck 200 may be formed into the upper wafer UW and the wafer W secured to the lower chuck 100 may be formed into the lower wafer LW. Thus, the upper wafer UW and the lower wafer LW may include one of the first wafer W1 and the second wafer W2, respectively.

In the present exemplary embodiment, the first wafer W1 or the processed wafer may be provided as the lower wafer LW and the second wafer W2 or the bare wafer may be provided as the upper wafer UW. However, the bare wafer may also be provided as the lower wafer LW and the processed wafer may also be provided as the upper wafer UW. For example, since the upper wafer UW and the lower wafer LW may be secured to the upper chuck 200 and the lower chuck 100, respectively, due to the same securing recipes and the same aligning requirements, the upper wafer UW may be sufficiently folded on the lower wafer LW just when the upper chuck 200 and the lower chuck 100 are controlled to have the same central axis. In this case, the upper chuck 200 and the lower chuck 100 may be symmetrical with each other in a vertical direction in the bonding apparatus 950.

Figure 11A:
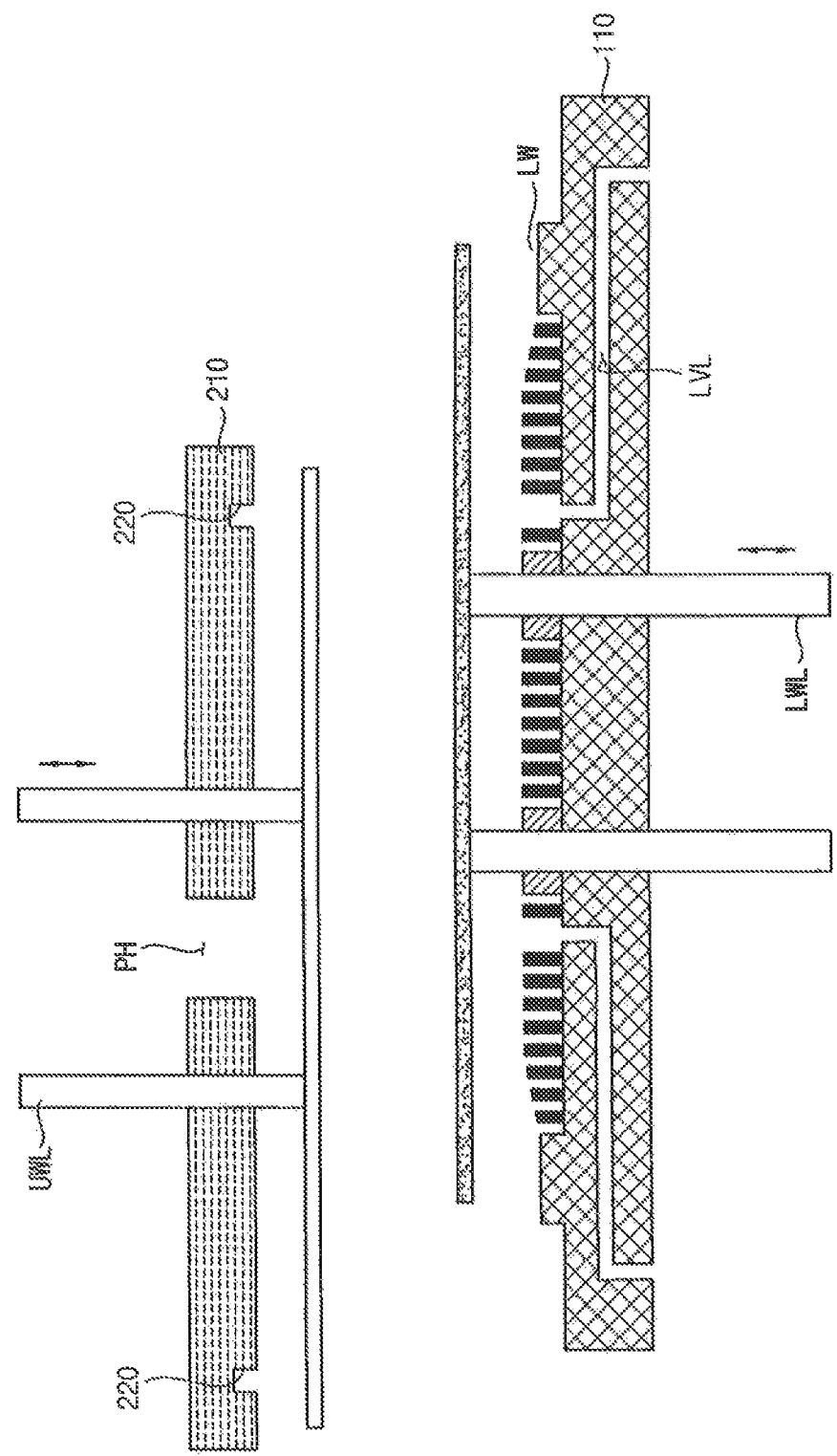

FIGS. 11A and 11B are cross sectional views illustrating processing steps for securing the wafers W to the upper chuck 200 and the lower chuck 100 in the wafer bonding system 1000 shown in FIG. 9 in accordance with an exemplary embodiment of the inventive concept.

Referring to FIG. 11A, the wafer W extracted from the loading port 600 may be transferred on one of a lower wafer lift LWL and an upper wafer lift UWL by the transfer arm 720. The lower wafer lift LWL may penetrate through the lower chuck 100 and the upper wafer lift UWL may penetrate through the upper chuck 200.

When the wafer W is arranged on the lower wafer lift LWL, the lower wafer lift LWL may move downwards through the lifting hole LH until the wafer W contacts the support pins 120. Then, the wafer W may be secured to the support pins 120 (and also to the lower chuck 100) by the lower wafer holder 130, to thereby form the lower wafer LW. In this case, the support pins 120 may be protruded from the surface of the lower chuck 100 and the wafer W may be deformed into a curved shape according to the surface profile of the support pins 120.

In the same way, when the wafer W is arranged on the upper wafer lift UWL, the upper wafer lift UWL may move upwards through the lifting hole LH until the wafer W contacts the upper chuck 200. Then, the wafer W may be secured to the upper chuck 200 by the upper wafer holder 220, to thereby form the upper wafer UW. In this case, the support pins 120 may be protruded from the surface of the lower chuck 100 and the wafer W may be deformed into a curved shape according to the surface profile of the support pins 120.

When the upper chuck 200 combined with the upper wafer UW and the lower chuck 100 combined with the lower chuck LW are prepared in the bonding buffer 940, the upper chuck 200 and the lower chuck 100 may be transferred to the bonding apparatus 950 along the transfer rail 930. Thereafter, the upper wafer UW and the lower wafer LW may be bonded to each other, thereby forming the bonded wafer BW.

The bonding apparatus 950 may have the same structures as the wafer bonding apparatus 500 shown in FIGS. 1 to 8, and thus any detailed descriptions on the bonding apparatus 950 may be omitted.

For example, a plurality of the gas injectors 410 may be connected to the base plate 920 at the top portion of the bonding chamber 910 by moving wires. Thus, the gas injectors 410 may move downwards along the moving wire from the top portion of the bonding chamber 910 in the bonding space BS. Thus, the filling gases G may be injected into the inter-wafer gap space IWS.

In contrast, the gas injectors 410 may be connected to the lower gas supply hole LSH and/or the upper gas supply hole USH, respectively. The filling gas G may be injected into the inter-wafer gap space IWS through the lower gas supply hole LSH and the upper gas supply hole USH with high efficiency.

The chemical reaction between the filling gas G and the upper and the lower wafers UW and LW can be prevented in the inter-wafer gap space IWS. For example, the filling gas G may include an inactive gas such as argon (Ar) gas, nitrogen (N2) gas and helium (He) gas. In addition, oxygen (O2) gas may also be used as the filling gas G, because an insulation layer may be formed on the upper and the lower wafers U W and LW by the chemical reaction between the oxygen (O2) gas and the silicon wafer.

In addition, an inactive gas having a negative Joule-Thomson coefficient may be used as the filling gas G for preventing the vapor condensation due to the adiabatic expansion of the air in the inter-wafer gap space IWS, thereby preventing bubble defects on the surfaces of the upper and the lower wafers UW and LW.

The shielding wall 490 may be further provided on the edge portion of the lower chuck 100 and the upper chuck 200 in such a way that the inter-wafer gap space IWS may be enclosed by the shielding wall 490 and separated from its surroundings. Thus, the inter-wafer gap space IWS may be formed as a closed space by the shielding wall 490 and the filling gas G may be supplied into the closed space, thereby increasing the injection efficiency of the filling gases G.

Accordingly, the misalignment and the vapor condensation may be minimized in the bonding process for bonding the upper and the lower wafers UW and LW to each other.

Hereinafter, the method of bonding the wafers W is described in detail with reference to FIGS. 12 to 13D.

Figure 12:
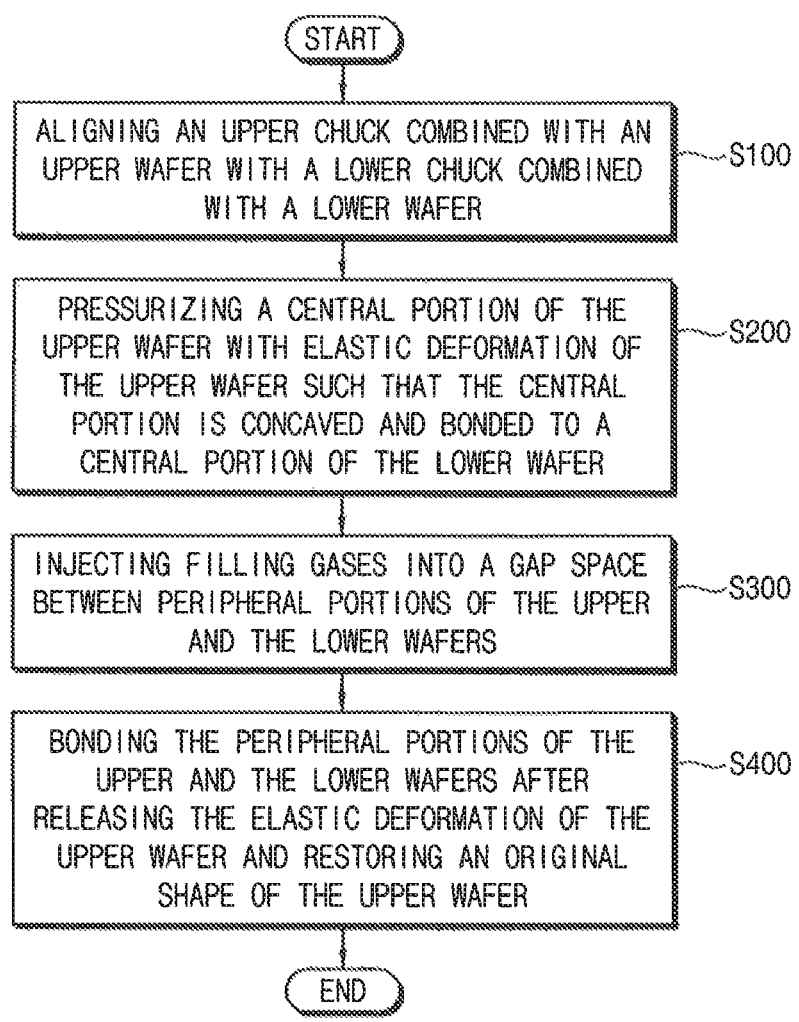
FIG. 12 is a flow chart showing a method of bonding wafers in the wafer bonding system shown in FIG. 9 in accordance with an exemplary embodiment of the inventive concept.

FIG. 12 is a flow chart showing a method of bonding wafers in the wafer bonding system shown in FIG. 9 in accordance with an exemplary embodiment of the inventive concept. FIGS. 13A to 13D are cross sectional views illustrating processing steps for the method of bonding wafers shown in FIG. 12.

Referring to FIGS. 12 and 13A, the lower chuck 100 combined with the lower wafer LW and the upper chuck 200 combined with the upper wafer UW may be transferred to the bonding chamber 910 and the lower chuck 100 and the upper chuck 200 may be aligned with each other (step S100).

For example, the lower chuck 100 may be mounted on the bottom portion of the bonding apparatus 950 and the upper chuck 200 may be mounted on the ceiling portion of the bonding apparatus 950. Then, the lower chuck 100 and the upper chuck 200 may be aligned with each other in such a way that the lower chuck 100 and the upper chuck 200 may have the same central axis.

Since the upper wafer UW and the lower wafer LW may be secured to the upper chuck 200 and the lower chuck 100, respectively, according to the same securing recipes and the same aligning requirements, the upper wafer UW may be sufficiently folded on the lower wafer LW at the point when the upper chuck and the lower chuck are aligned with each other to have the same central axis. In other words, the upper chuck 200 and the lower chuck 100 may be symmetrical with each other in a vertical direction in the bonding apparatus 950.

In the present exemplary embodiment, the lower wafer LW may be supported by the support pins 120 having different heights, and thus, the surface profile of the lower wafer LW may be deformed into the convex curve CC1 according to the surface profile of the support pins 120.

In such a case, at least one of the upper chuck 200 or the lower chuck 100 may move upwards or downwards to each other in the vertical direction to control a gap between the upper wafer UW and the lower wafer LW. Thus, the gap between the upper wafer UW and the lower wafer LW may be controlled to a recipe distance of the requirements of the direct silicon bonding process. In addition, the size of the inter-wafer gap space IWS may be determined by the width of the gap between the upper wafer UW and the lower wafer LW.

Figure 13B:
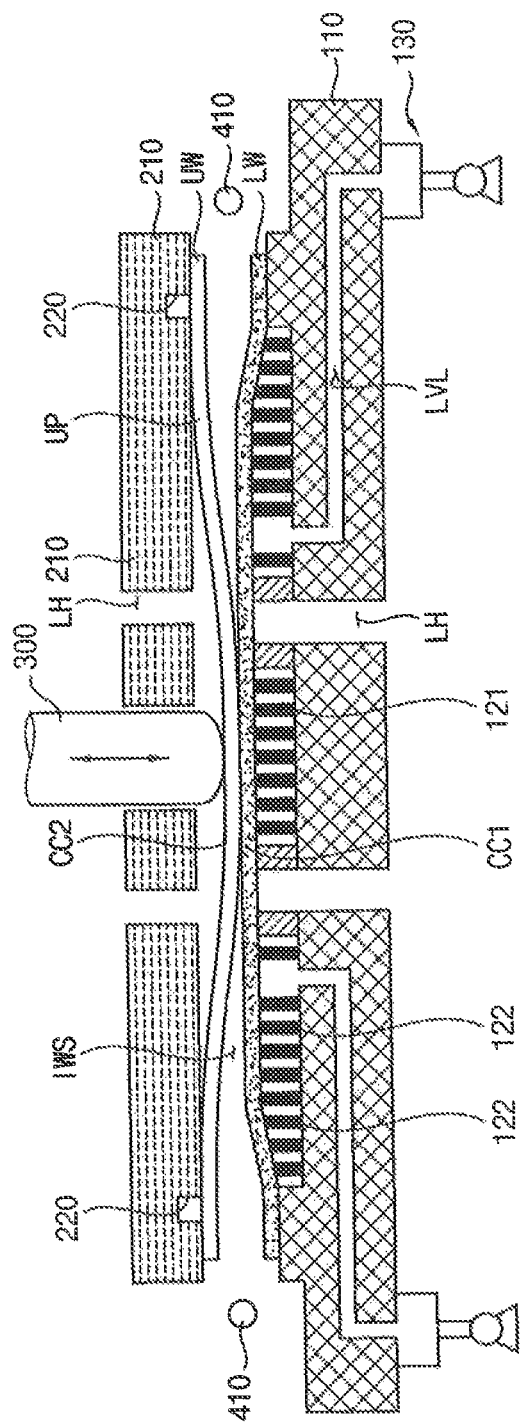

Referring to FIGS. 12 and 13B, the central portion of the upper wafer UW may be pressurized under the condition that the peripheral portion of the upper wafer UW is still secured to the upper chuck 200 until the central portion of the upper wafer UW contacts the central portion of the lower wafer LW. In this case, the surface profile of the upper wafer UW may be deformed into the concave curve CC2 (step S200).

For example, the bonding initiator 300, which may be secured to the base plate 920 at the upper portion of the bonding apparatus 950, may move downwards through the penetration hole PH until a lower tip of the bonding initiator 300 is positioned under the upper chuck 200.

Thus, the upper wafer UW, which may be secured to the upper chuck 200 in the flat shape, may be pushed downwards and be separated from the upper chuck 200 at its central portion by the bonding initiator 300 while the peripheral portion of the upper wafer UW is still secured to the upper chuck 200. Thus, the surface profile of the upper wafer UW may be deformed into the concave curve CC2 within the elastic deformation.

Since the surface profile of the lower wafer LW may be deformed into the convex curve CC1 protruding upwards toward the upper wafer UW, the central portion of the upper wafer UW may make first contact with the central portion of the lower wafer LW and the bonding process between the upper wafer UW and the lower wafer LW may be initiated at their central portions. In other words, the bonding process may be initiated at the central portions of the upper and the lower wafers UW and LW by the bonding initiator 300.

Figure 13C:
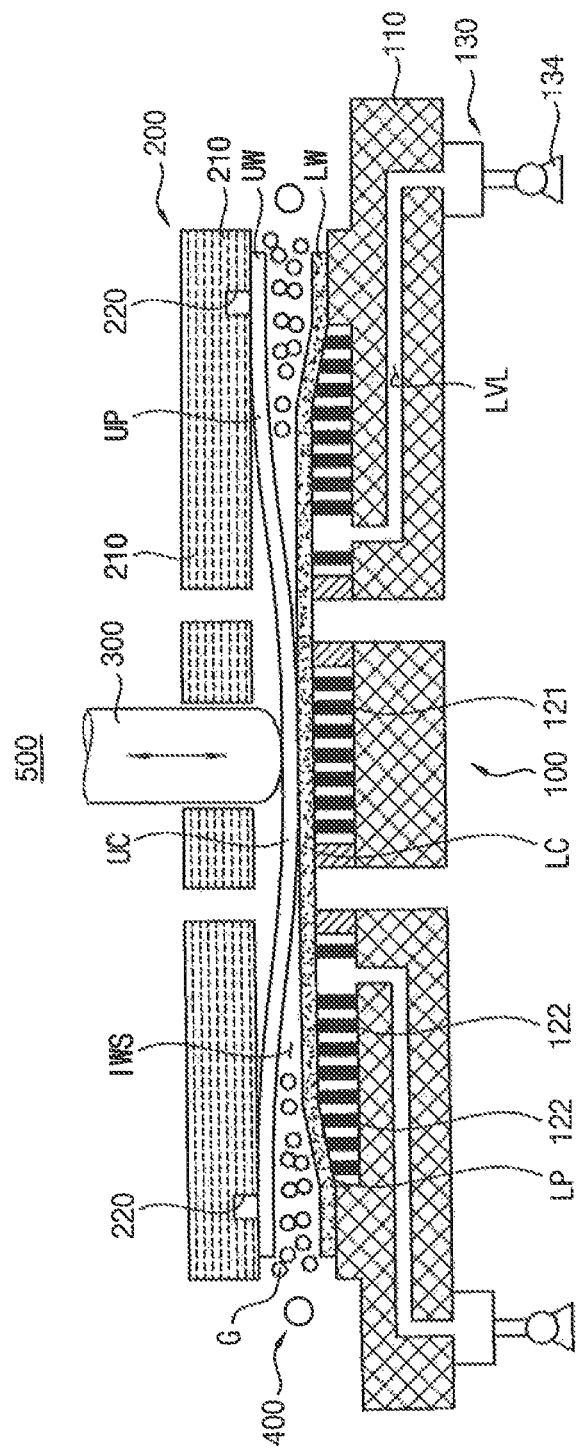

Referring to FIGS. 12 and 13C, the filling gases G may be supplied into the inter-wafer gap space IWS between the peripheral portions of the upper wafer UW and the lower wafer LW (step S300).

The bonding initiator 300 may be stopped and the filling gases G may be supplied into the inter-wafer gap space IWS at the moment when the central portion of the upper wafer UW makes contact with the central portion of the lower wafer LW. The filling gases G may be supplied into the inter-wafer gap space IWS in such a way that the inner pressure of the inter-wafer gap space IWS may be under a near-atmospheric pressure, e.g., under a pressure of about 0.5 atm to about 1.5 atm.

For example, the inactive gases such as argon (Ar), nitrogen (Ni) and helium (He) may be supplied into the inter-wafer gap space IWS for minimizing the chemical reactions with the upper and the lower wafers UW and LW. In addition, oxygen (O2) gases may also be used as the filling gas G, because the chemical reaction of oxygen (O2) and silicon (Si) may provide a silicon oxide (SiO2) layer on the upper and the lower wafers UW and LW and the upper and the lower wafers UW and LW may be protected from surroundings of the inter-wafer gap space IWS.

For example, when an inactive gas having a negative Joule-Thomson coefficient is used as the filling gas G, the temperature reduction due to the adiabatic expansion of air in the inter-wafer gap space IWS may be minimized and, as a result, the vapor condensation on the surfaces of the upper and lower wafers UW and LW (which may be referred to as a bubble defect) may be sufficiently prevented in the inter-wafer gap space IWS. Therefore, the bubble defects may be sufficiently minimized in the bonding process.

In a modified exemplary embodiment of the inventive concept, the filling gases G may be supplied into the inter-wafer gap space IWS through the upper and lower supply holes USH and LSH penetrating through the upper chuck 200 and the lower chuck 100 as shown in FIGS. 5 and 6. In another modified exemplary embodiment of the inventive concept, the shielding wall 490 may be interposed between the lower chuck 100 and the upper chuck 200 in such a way that the inter-wafer gap space IWS may be enclosed and separated from its surroundings by the shielding wall 490. Thus, the inter-wafer gap space IWS may be formed into the closed space and the filling gas G may be supplied into the closed inter-wafer gap space IWS, thereby increasing the filling efficiency of the filling gas G.

Referring to FIGS. 12 and 13D, the peripheral portion of the upper wafer UW may be sufficiently restored into its original shape and may be bonded to the peripheral portion of the lower wafer LW, thereby forming the bonded wafer BW (step S400).

When the inner pressure of the inter-wafer gap space IWS reaches an expected pressure such as the near-atmospheric pressure, the bonding initiator 300 may move back upwards and the upper wafer holder 220 may be released.

Thus, the peripheral portion of the upper wafer UW may be separated from the upper chuck 200 and fall down toward the peripheral portion of the lower wafer LW. For example, the upper wafer UW may fall down by virtue of fluctuation or oscillation of its peripheral portion due to the elastic deformation. In such a case, the falling down of the peripheral portion of the upper wafer UW may be prevented by the filling gases G in the inter-wafer gap space IWS, so that the bonding time for bonding the peripheral portions of the upper and the lower wafers UW and LW may be extended to such a degree that the elastic deformation of the upper wafer W may be fully released and the upper wafer UW may be restored to its original shape.

In other words, the bonding controller 400 may control the bonding time of the upper wafer UW to the lower wafer LW by using the falling gases G in such a way that the bonding of the peripheral portions of the upper and the lower wafers UW and LW may be initiated after the elastic deformation of the upper wafer UW ends such that the upper wafer UW returns to its original shape.

Accordingly, the bonding time for the upper and the lower wafers UW and LW may increase to allow the upper wafer UW to return to its original shape after being deformed and the misalignment between the upper and the lower wafers UW and LW may be sufficiently minimized in the bonding process.

When the upper wafer UW is not sufficiently bonded to the lower wafer LW, the bonding controller 400 may be stopped and the upper chuck 200 may be separated from the upper wafer UW. Thereafter, the upper chuck 200 may move upwards and the upper and the lower wafers UW and LW may remain on the lower chuck 100 as the bonded wafer BW. The bonded wafer BW may be removed from the lower chuck 100 and an additional process such as a heat treatment may be selectively conducted to the bonded wafer BW.

While the present exemplary embodiment discloses that the filling gas G may be supplied into the inter-wafer gap space IWS at the moment when the central portion of the upper wafer UW is bonded to the central portion of the lower wafer LW, the filling gas G may be supplied at another time according to the requirements of the bonding process and the configurations of the wafer bonding system 1000.

For example, the filling gases G may be supplied into the inter-wafer gap space IWS before the bonding of the central portions of the upper and lower wafers UW and LW. In such a case, the filling gases G may be supplied just after the gap distance between the upper wafer UW and the lower wafer LW is determined. Therefore, the inner pressure of the inter-wafer gap space IWS may be already set up before the upper wafer UW falls down, and thus, the upper wafer UW may be prevented from falling as soon as the peripheral portion of the upper wafer UW is separated from the upper chuck 200.

According to the exemplary embodiments of the inventive concept, the filling gases G may be filled into the inter-wafer gap space IWS to a predetermined inner pressure. Thus, the peripheral portion of the upper wafer UW may be prevented from falling by the filling gases G, thereby reducing the falling speed of the upper wafer UW. Accordingly, the bonding process between the peripheral portion of the upper wafer UW and the peripheral portion of the lower wafer LW may be performed after a sufficient release of the elastic deformation of the upper wafer UW (e.g., after the upper wafer UW returns to its original state from a deformed state), thereby sufficiently preventing the misalignment between the upper wafer UW and the lower wafer LW in the bonding process.

In addition, an inactive gas having a negative Joule-Thomson coefficient may be used as the filling gas G. Thus, in the boding process between the upper wafer UW and the lower wafer LW, the vapor condensation due to the adiabatic expansion of air may be sufficiently prevented on the surfaces of the upper and lower wafers UW and LW in the inter-wafer gap space IWS although the size of the inter-wafer gap space IWS may be enlarged from the central portions to the peripheral portions of the upper and lower wafers UW and LW.

Accordingly, the misalignment of the upper and lower wafers UW and LW and the vapor condensation may be minimized in the bonding process.

Exemplary embodiments of the inventive concept described above provide a wafer bonding apparatus for directly bonding upper and lower wafers in which a gas injector is provided for supplying bonding control gases into a gap space between the upper and lower wafers.

While the inventive concept has been described with reference to exemplary embodiments thereof, those skilled in the art will readily appreciate that many modifications are possible without departing from the scope of the inventive concept as defined by the following claims.

What is claimed is:

1. A wafer bonding apparatus, comprising:
a lower chuck to which a lower wafer is secured at a peripheral portion of the lower chuck;
an upper chuck to which an upper wafer is secured;
a bonding initiator pressuring a central portion of the upper wafer until the central portion of the upper wafer reaches a central portion of the lower wafer, thereby initiating a bonding process of the upper and the lower wafers by deforming the upper wafer; and
a gas injector controlling a bonding speed between a peripheral portion of the upper wafer and a peripheral portion of the lower wafer such that the upper wafer becomes un-deformed prior to bonding the peripheral portion of the upper wafer and the peripheral portion of the lower wafer and such that when the central portion of the upper wafer is in contact with the central portion of the lower wafer a gap between the peripheral portion of the upper wafer and the peripheral portion of the lower wafer formed by a filling gas injected by the gas injector prevents the peripheral portion of the upper wafer from falling,
wherein the lower chuck includes a lower body, and a plurality of support pins protruded from the lower body upwards such that protruding heights of the support pins increase from a peripheral portion to a central portion of the lower body,
wherein the lower body is divided into an inner portion and an outer portion by a stepped portion that protrudes from an upper surface of the lower body and has a ring shape along a circumferential line of the lower body, and
wherein a lift guide is arranged adjacent to a lift hole at the central portion of the lower body, the lift guide protruding from the upper surface of the lower body farther than the stepped portion such that support pins adjacent to the stepped portion have a minimal height and support pins adjacent to the lift guide have a maximal height.

2. The wafer bonding apparatus of claim 1, wherein the lower wafer is secured to the lower chuck with a convex upwards shape and the upper wafer is deformed to have a concave downwards shape when the bonding process is initiated at the central portions of the lower and the upper wafers, and the gap is enlarged from the central portions of the upper and the lower wafers to the peripheral portions of the upper and the lower wafers.

3. The wafer bonding apparatus of claim 2, wherein the lower chuck further includes a lower wafer holder penetrating through the lower body and securing the lower wafer to the support pins, and the upper chuck includes an upper body having a hole through which the bonding initiator passes and an upper wafer holder penetrating through the upper body and securing the peripheral portion of the upper wafer to the upper body.

4. The wafer bonding apparatus of claim 3, wherein the gas injector is spaced apart from the upper and the lower chucks to face the gap such that the filling gas is directly injected into the gap.

5. The wafer bonding apparatus of claim 3, wherein the gas injector is connected to at least one of the upper chuck and the lower chuck such that the filling gas is injected through at least one of the upper chuck and the lower chuck.

6. The wafer bonding apparatus of claim 5, wherein a supply hole is provided in at least one of a peripheral portion of the upper body and the peripheral portion of the lower body such that the gas injector is connected with the supply hole.

7. The wafer bonding apparatus of claim 3, further comprising a shielding wall enclosing the gap to form a closed gap.

8. The wafer bonding apparatus of claim 7, wherein the shielding wall is in contact with a peripheral portion of a lower surface of the upper body and with a peripheral portion of the upper surface of the lower body along circumferential lines of the upper and the lower bodies.

9. The wafer bonding apparatus of claim 1, wherein the filling gas includes an inactive gas having a negative Joule-Thomson coefficient.

10. A wafer bonding system, comprising:
a bonding buffer securing an upper wafer to an upper chuck and a lower wafer to a lower chuck such that the upper wafer and the lower wafer are aligned with each other; and
a bonding apparatus in which the upper chuck combined with the upper wafer and the lower chuck combined with the lower wafer are arranged such that the upper chuck and the lower chuck have a common central axis and the upper and the lower wafers are bonded into a bond wafer,
wherein the bonding apparatus includes:
a bonding initiator pressuring a central portion of the upper wafer until the central portion of the upper wafer reaches a central portion of the lower wafer, thereby initiating a bonding process of the upper and the lower wafers by deforming the upper wafer; and
a gas injector controlling a bonding speed between a peripheral portion of the upper wafer and a peripheral portion of the lower wafer such that the upper wafer becomes un-deformed prior to bonding the peripheral portion of the upper wafer and the peripheral portion of the lower wafer and such that when the central portion of the upper wafer is in contact with the central portion of the lower wafer a gap between the peripheral portion of the upper wafer and the peripheral portion of the lower wafer formed by a filling gas injected by the gas injector prevents the peripheral portion of the upper wafer from falling,
wherein the lower chuck includes a lower body and a plurality of support ins protruded from the lower body,
wherein the lower body includes a stepped portion that protrudes from an upper surface of the lower body, and
wherein a lift guide is arranged adjacent to a lift hole at a central portion of the lower body, the lift guide protruding from the upper surface of the lower body farther than the stepped portion such that support pins adjacent to the stepped portion have a minimal height and support pins adjacent to the lift guide have a maximal height.

11. The wafer bonding system of claim 10, further comprising:
a bonding chamber enclosing the bonding buffer and the bonding apparatus in a bonding space;
a transfer rail transferring the upper chuck and the lower chuck between the bonding buffer and the bonding apparatus in the bonding space; and
a base plate on which the transfer rail is arranged in the bonding space.

12. The wafer bonding system of claim 10, wherein the gas injector is spaced apart from the upper chuck and the lower chuck to face the gap such that the filling gas is directly injected into the gap.

13. The wafer bonding system of claim 12, wherein the gas injector is connected to at least one of the upper chuck and the lower chuck such that the filling gas is injected through at least one of the upper chuck and the lower chuck.

14. The wafer bonding system of claim 13, further comprising a shielding wall enclosing the gap to form a closed gap.

15. The wafer bonding system of claim 11, wherein the bonding buffer includes a lifter arranged on the base plate and configured to linearly move such that the upper wafer is transferred to the upper chuck and the lower wafer is transferred to the lower chuck.

16. A wafer bonding apparatus, comprising:
a first chuck having a first wafer disposed thereon;
a second chuck having a second wafer disposed thereon;
a bonding initiator moving a central portion of the second wafer to contact a central portion of the first wafer, wherein the second wafer is deformed when it is moved to contact the central portion of the first wafer, and
a gas injector moving the central portion of the second wafer back towards the second chuck prior to bonding a peripheral portion of the second wafer and a peripheral portion of the first wafer,
wherein when the central portion of the first wafer is in contact with the central portion of the second wafer a gap between the peripheral portion of the first wafer and the peripheral portion of the second wafer formed by a gas injected by the gas injector prevents the peripheral portion of the second wafer from falling,
wherein the first chuck includes a body, the body includes a stepped portion that protrudes from an upper surface of the body and a lift guide adjacent to a lift hole at a central portion of the body, the lift guide protruding farther from the upper surface of the body than the stepped portion.

17. The wafer bonding apparatus of claim 16, wherein the second wafer is deformed to have a concave shape.

18. The wafer bonding apparatus of claim 17, wherein the first wafer has a convex shape.

19. The wafer bonding apparatus of claim 16, wherein the central portion of the second wafer is moved to the second chuck by the gas between the first wafer and the second wafer.

* * * * *